(12) United States Patent
Graef et al.

(10) Patent No.: US 8,323,403 B2
(45) Date of Patent: Dec. 4, 2012

(54) SOI WAFER AND METHOD FOR PRODUCING IT

(75) Inventors: Dieter Graef, Burghausen (DE); Markus Blietz, Tittmoning (DE); Reinhold Wahlich, Tittmoning (DE); Alfred Miller, Emmerting (DE); Dirk Zemke, Marktl (DE)

(73) Assignee: Siltronic AG, Munich (DE)

( * ) Notice: Subject to any disclaimer, the term of this patent is extended or adjusted under 35 U.S.C. 154(b) by 1357 days.

(21) Appl. No.: 12/016,225

(22) Filed: Jan. 18, 2008

(65) Prior Publication Data

US 2008/0153259 A1 Jun. 26, 2008

Related U.S. Application Data

(62) Division of application No. 11/104,715, filed on Apr. 13, 2005, now Pat. No. 7,394,129.

(30) Foreign Application Priority Data

Apr. 29, 2004 (DE) .................. 10 2004 021 113

(51) Int. Cl.
*C30B 29/06* (2006.01)
(52) U.S. Cl. ................. 117/13; 117/15; 117/19; 117/20
(58) Field of Classification Search .................. 117/19, 117/20, 13, 15
See application file for complete search history.

(56) References Cited

U.S. PATENT DOCUMENTS

| 5,374,564 A | 12/1994 | Bruel |
| 5,487,354 A | 1/1996 | von Ammon et al. |
| 5,891,265 A | 4/1999 | Nakai et al. |
| 6,146,459 A | 11/2000 | Park |
| 6,211,041 B1 | 4/2001 | Ogura |
| 6,342,724 B1 | 1/2002 | Wark et al. |
| 6,352,909 B1 | 3/2002 | Usenko |
| 6,489,654 B2 | 12/2002 | Ogura |
| 6,492,682 B1 | 12/2002 | Akiyama et al. |
| 6,663,708 B1 | 12/2003 | Morita et al. |
| 6,756,286 B1 | 6/2004 | Moriceau et al. |
| 2001/0030348 A1 | 10/2001 | Falster |

(Continued)

FOREIGN PATENT DOCUMENTS

DE          44 14 947 A1     8/1995

(Continued)

OTHER PUBLICATIONS

A.J. Auberton-Hervé et al., "Silicon on Insulator Wafers Using the Smart Cut® Technology," The Electrochem Soc., PV98-1 (1998) 1341.

(Continued)

*Primary Examiner* — Bob M Kunemund
(74) *Attorney, Agent, or Firm* — Brooks Kushman P.C.

(57) ABSTRACT

An SOI wafer is constructed from a carrier wafer and a monocrystalline silicon layer having a thickness of less than 500 nm, an excess of interstitial silicon atoms prevailing in the entire volume of the silicon layer. The SOI wafers may be prepared by Czochralski silicon single crystal growth, the condition $v/G < (v/G)_{crit} = 1.3 \times 10^{-3}$ cm$^2$/(K·min) being fulfilled at the crystallization front over the entire crystal cross section, with the result that an excess of interstitial silicon atoms prevails in the silicon single crystal produced; separation of at least one donor wafer from this silicon single crystal, bonding of the donor wafer to a carrier wafer, and reduction of the thickness of the donor wafer, with the result that a silicon layer having a thickness of less than 500 nm bonded to the carrier wafer remains.

18 Claims, 5 Drawing Sheets

U.S. PATENT DOCUMENTS

| | | |
|---|---|---|
| 2002/0113265 A1 | 8/2002 | Falster |
| 2003/0036289 A1 | 2/2003 | Kawamura et al. |
| 2004/0014302 A1 | 1/2004 | Tolchinsky et al. |
| 2004/0126985 A1 | 7/2004 | Bendernagel et al. |
| 2004/0142542 A1 | 7/2004 | Murphy et al. |
| 2004/0175899 A1 | 9/2004 | Lu et al. |

FOREIGN PATENT DOCUMENTS

| | | |
|---|---|---|
| EP | 0 553 551 A1 | 3/1993 |
| EP | 0 969 505 A2 | 1/2000 |
| EP | 1 170 405 A1 | 1/2002 |
| JP | 11-307747 | 11/1999 |
| JP | 2001044398 A | 2/2001 |
| KR | 10-2000-075400 A | 12/2000 |
| KR | 10-2001-0016973 A | 3/2001 |
| KR | 10-295040 B1 | 4/2001 |
| KR | 10-2002-0024371 A | 3/2002 |
| KR | 10-2003-0039512 A | 5/2003 |
| WO | 99/35674 A1 | 7/1999 |
| WO | 03/003430 A2 | 1/2003 |

OTHER PUBLICATIONS

D. Gräf et al., "Characterization of Crystal Quality by Crystal Originated Particle Delineation and the Impact on the Silicon Wafer Surface," J. Electrochem Soc., 145 (1998) 275.
G. Kissinger et al., "Influence of Residual Point Defect Supersaturation on the Formation of Grown-In Oxide Precipitate Nuclei in CZ-Si," J. Electrochem. Soc., 145 (1998) L75.
R. Schmolke et al., "Characterization of Interstitial-Related Bulk Defects in p Silicon Substrates by Epitaxial Deposition," Solid State Phenomena vols. 82-84 (2002) 231.
R. Schmolke et al., "Crystal Related Surface Defects: Review, Progress and Outlook," The Electrochem. Soc. PV99-1 (1999) 386.
S.S. Kim et al., "The Effect of the Crystal Grown-In Defects on the Pause Tail Characteristics of Megabit Dynamic Random Access Memory Devices," J. Electro. Chem. Soc. 141 (1994) 1872.
F. Passek et al., "Discrimination of Defects on Epitaxial Silicon Wafers," The Electrochem. Soc. PV97-22 (1997) 439.
R. Winkler et al., Improvement of the Gate Oxide Integrity by Modifying Crystal Pulling and Its Impact on Device Failures, J. Electrochem Soc. 141 (1994) 1398.
E. Dornberger et al., "The Dependence of Ring-Like Distributed Stacking Faults on the Axial Temperature Gradient of Growing Czochralski Silicon Crystals," J. Electrochem. Soc. 143 (1996) 1648.
M. Hourai et al., "Nature and Generation of Grown-in Defects in Czochralski Silicon Crystals," Electrochem. Soc. Proc. vol. 98-1 (1998) 453.
T. Mori et al., "Numerical Simulation of Two-Dimensional Grown-in Defect Dynamics in Czochralski Crystal Growth of Silicon," The Electrochem. Soc. PV99-1 (1999) 425.
D. Gräf et al., "Characterization of Crystal Quality by Delineation of COP and the Impact on the Silicon Wafer Surface," The Electrochem. Soc. Proc. vol. 96-13 (1996) 117.
W.V. Ammon et al., "Defect Behavior of Oxygen Doped FZ Crystals—A Comparison to CZ," The Electrochem. Soc. Proc. vol. 93-15 (1993) 36.
D. Zemke et al., "Investigations on the Correlation Between Growth Rate and Gate Oxide Integrity of Czochralski-Grown Silicon," Journal of Crystal Growth, vol. 139, Issues 1-2 (1994) 37.
Patent Abstracts of Japan corresponding to JP 11-307747.
V.V. Voronkov, The Mechanism of Swirl Defects Formation in Silicon, Journal of Crystal Growth, 59, (1982) 625-643.
Winkler et al., Proc. Electrochem. Soc. (1994), 7th International Symposium on Silicon Materials Science and Technology, May 23-27, 1994, p. 973-986.

SOI WAFER AND METHOD FOR PRODUCING IT

This application is a division of U.S. application Ser. No. 11/104,715 filed Apr. 13, 2005, now U.S. Pat. No. 7,394,129 and also claims priority to German Application DE 10 2004 021 113.2 filed Apr. 29, 2004.

BACKGROUND OF THE INVENTION

1. Field of the Invention

The present invention relates to an SOI wafer and also to a method for producing it by transferring a silicon layer from a donor wafer to a carrier wafer.

2. Background Art

SOI wafers ("silicon on insulator") are generally produced by transferring a silicon layer from a so-called donor wafer to a carrier wafer ("handle wafer" or "base wafer"). Methods for producing SOI wafers by means of the transfer of a silicon layer are known for example by the names Smart Cut® (EP 533551 A1) and Genesis Process®. A further method is described in WO 03/003430A2. SOI wafers comprise a carrier wafer and a silicon covering layer ("top layer" or "device layer") connected thereto, which represents the so-called active layer that is provided for the production of electronic components. Either the complete carrier wafer is composed of an electrically insulating material such as glass or sapphire, or the silicon covering layer is bonded to the carrier wafer by means of an electrically insulating intermediate layer, for example one composed of silicon oxide. In the latter case, the intermediate layer is referred to as a buried oxide layer "BOX", and the carrier wafer need not, in this case, be an insulator. By way of example, a semiconductor wafer, preferably a silicon wafer, may be employed as the carrier wafer.

Very high requirements are required of the silicon covering layer. By way of example, the covering layer ought not to have any so-called HF defects. The latter involve "holes" in the covering layer, which may arise inter alia due to the fact that the layer transferred from the donor wafer contains COPs ("crystal originated particles"; vacancy agglomerates) that exceed a critical size. When the covering layer is treated with aqueous hydrofluoric acid solution (HF), the latter can penetrate through the holes to the silicon oxide layer and locally dissolve the latter. The presence of HF defects impairs the function of components produced on the covering layer (A. J. Auberton-Hervé, T. Barge, F. Metral, M. Bruel, B. Aspar, H. Moriceau, THE ELECTROCHEM. SOC. PV98-1 (1998) 1341).

Generally, defect types that are attributable to the presence of point defects, i.e. vacancies or interstitial silicon atoms, and which occur in silicon wafers, are described in the following paragraphs.

Agglomerates of vacancies are referred to, depending on the preparation or detection method, as "Flow Pattern Defects" (FPDs), "Gate Oxide Integrity (GOI) Defects" or "Crystal Originated Particles" (COPs) (D. Gräf, M. Suhren, U. Lambert, R. Schmolke, A. Ehlert, W. v. Ammon, P. Wagner, J. ELECTROCHEM. SOC. 145 (1998) 275).

In the vacancy-rich region in which the vacancies do not agglomerate, oxidation induced stacking faults (OSF) are additionally formed since non-agglomerated vacancies promote oxidization (G. Kissinger, J. Vanhellemont, U. Lambert, D. Gräf, E. Dornberger, H. Richter; J. ELECTROCHEM. SOC. 145 (1998) L75). The formation of the OSF nuclei and also the size of the OSF increase with the oxygen content of the silicon wafer. Therefore, when using vacancy-rich perfect silicon wafers, a low oxygen content is additionally necessary in order to avoid these defects that are harmful to the SOI wafers. In order to achieve this low oxygen content, it is necessary to employ a complicated pulling method, for example using a magnetic field. So-called "perfect silicon" wafers are understood to be wafers which, over substantially their whole area, comprise a so-called neutral region in which point defects (vacancies and/or interstitial silicon atoms) are present but in which agglomeration of point defects does not occur.

Vacancy agglomerates and OSF defects lead to holes in the silicon covering layer of an SOI wafer or to a reduction of the effective layer thickness and thus to a failure of the corresponding components at these locations.

Agglomerates of interstitial silicon atoms lead, in silicon crystals, to dislocation loops having extents of several micrometers (R. Schmolke, W. Angelberger, W. von Ammon, H. Bender, SOLID STATE PHENOMENA VOLS. 82-84 (2002) 231), which likewise adversely affects the function of components produced therefrom.

In order to minimize the problems that arise from the various defects mentioned when producing electronic components on the silicon covering layer of an SOI wafer, epitaxially coated silicon wafers (R. Schmolke, D. Gräf, THE ELECTROCHEM. SOC. PV99-1 (1999) 386) or so-called "perfect silicon wafers" (see U.S. Pat. No. 6,342,725 B2) are generally used as donor wafers. It is known from epitaxially coated wafers, in particular, that such wafers have outstanding material properties with low defect densities. Therefore, epitaxially coated wafers are used for particularly demanding component applications (S. S. Kim, W. Wijaranakula, J. ELECTROCHEM. SOC. 141, (1994) 1872).

The use of epitaxially coated silicon wafers as donor wafers entails the following disadvantages: after the silicon wafer has been transferred to the carrier wafer, the donor wafer is generally reused a number of times in order to enable the SOI wafers to be produced as cost-effectively as possible. If an epitaxially coated silicon wafer is used as a donor wafer, either a very thick epitaxial layer has to be deposited prior to the first use or a new epitaxial deposition has to be carried out again after each use as a donor wafer. Both possibilities are associated with a high outlay and are therefore economically undesirable. Moreover, epitaxially coated silicon wafers have structural defects such as hillocks, spikes and epitaxial stacking faults (F. Passek, R. Schmolke, U. Lambert, G. Puppe, P. Wagner, THE ELECTROCHEM. SOC. PV97-22 (1997) 40), which lead to problems during the bonding of the donor wafer to the carrier wafer.

EP 1170405 A1 and U.S. Pat. No. 6,342,725 B2 describe the use of donor wafers originating from single crystals that have been produced by means of the Czochralski crucible pulling method (referred to hereinafter as the "CZ" method). The parameters of the CZ method are chosen such that the resulting single crystal has a so-called neutral region in which point defects (vacancies or interstitial silicon atoms) are admittedly present, but in which agglomeration of point defects does not occur. Nevertheless, even perfect silicon wafers potentially have small vacancy agglomerates. In order to produce a perfect silicon single crystal that has no agglomerated point defects, it is necessary, during the CZ method, to meet the condition $$v/G = (v/G)_{crit} \tag{1}$$

where v is the pulling speed and G is the axial temperature gradient at the crystallization front. $(v/G)_{crit} = 1.3 \times 10^{-3}$ cm²/(K·min) is a value of this quotient derived from simulation calculations (T. Mori, T. Sinno, R. Brown, THE ELECTROCHEM. SOC. PV99-1 (1999) 425) and confirmed empirically, and has the effect that when it is complied with, no agglomerated point defects are generated, with the result that so-called "perfect" material can be produced. Consequently, only an extremely narrow process window is available during crystal pulling. This narrow process window leads to low yields in the CZ method and, moreover, requires complicated test methods in order to ensure that the crystal quality corresponds to the requirements needed. In this case, there is furthermore a strong tendency for at least the radial defect behavior to be inhomogeneous. This means that both vacancy-rich regions (with potential OSF defects) and regions with interstitial silicon atoms occur simultaneously in a silicon wafer.

Another approach for keeping the defects in donor wafers as small as possible and reducing defect densities consists in using vacancy-rich crystals with nitrogen as a co-dopant (D. Gräf, M. Suhren, U. Lambert, R. Schmolke, A. Ehlert, W. v. Ammon, P. Wagner, THE ELECTROCHEM. SOC. PROC. Vol. 96-13 (1996) 117). As a result of co-doping with nitrogen, it is possible to suppress vacancy agglomerates ("voids") present in vacancy-rich crystals during growth and thus to reduce the harmful influence on the SOI structures (EP 969505 A2). However, even small vacancy agglomerates lead to adverse effects on SOI structures, particularly if the thickness of the silicon covering layer lies in the region of 100 nm or less. This is primarily the case with SOI wafers that are provided for the production of so-called "partially depleted," and in particular, "fully depleted" SOI structures.

SUMMARY OF THE INVENTION

Therefore, objects of the invention were to provide a suitable donor wafer which both can be produced in high yield and also ensures a low frequency of faults in the production of components on the resultant SOI wafer. These and other objects are achieved by means of an SOI wafer comprising a carrier wafer and a monocrystalline silicon layer having a thickness of less than 500 nm, an excess of interstitial silicon atoms prevailing in the entire volume of the silicon layer.

BRIEF DESCRIPTION OF THE DRAWINGS

FIG. 7 illustrates the result of a gate oxide test carried out on in each case an epitaxially coated silicon wafer and a silicon wafer, in which agglomerated interstitial silicon atoms prevail.

DETAILED DESCRIPTION OF THE PREFERRED EMBODIMENT(S)

Figure 1:
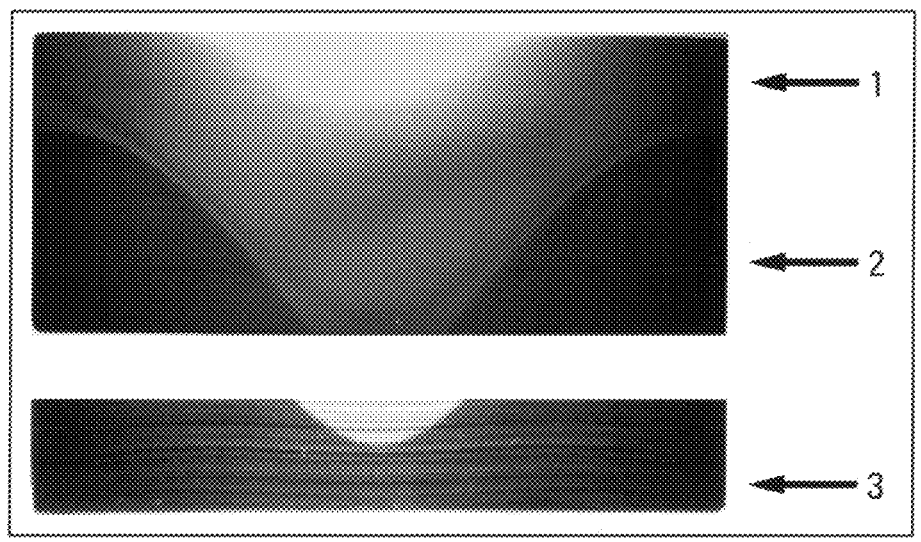
FIG. 1 shows longitudinal sections of silicon single crystals having a diameter of 200 mm with a region in which vacancies prevail and a region in which interstitial silicon atoms prevail.

Contrary to the teachings of the prior art, the donor wafer used in accordance with the invention is not a perfect silicon wafer (as described above), but rather a silicon wafer that is distinguished by an excess of interstitial silicon atoms. Preferably, the donor wafer, and thus also the silicon covering layer of the SOI wafer that is produced therefrom, has an excess of agglomerated interstitial silicon atoms at least in a partial region. The donor wafer may have an arbitrary crystal orientation that arises according to the requirements of the component application, for example <100>, <110>, <111> or <113>.

It is known that in silicon wafers in which interstitial silicon atoms are the prevailing defect type, large dislocation loops form and render the wafers unusable for the production of electronic components (R. Winkler, M. Sano; J. ELECTROCHEM. SOC. 141 (1994) 1398). U.S. Pat. No. 6,342,725 B2 also indicates that agglomerated point defects of both types (vacancies and interstitial silicon atoms) adversely influence the performance of components. Since these defects were expected also to have an adverse effect in the silicon covering layer of an SOI wafer in the same manner, the skilled artisan would not choose to use such wafers as donor wafers for the production of SOI wafers. Rather, as described above, prior art processes have always used epitaxially coated silicon wafers, silicon wafers with a neutral region, or perfect silicon wafers as donor wafers.

The investigations resulting in the present invention have shown that the agglomerated interstitial silicon atoms have an adverse effect only in bulk silicon, where the stresses arising from agglomeration in the silicon lattice are compensated by the formation of large-volume dislocation loops. In the case of a layer thickness of less than 500 nm, as in the present invention, this is not possible: the growth of the dislocation loops is limited to a size of less than 500 nm by the insulator (electrically insulating carrier wafer or electrically insulating layer, BOX) lying directly below the surface.

The invention also relates to a method for producing an SOI wafer according to the invention, comprising the following steps:

production of a silicon single crystal by crucible pulling according to Czochralski, the condition $v/G<(v/G)_{crit}=1.3\times 10^{-3}$ cm$^2$/(K·min) being fulfilled at the crystallization front over the crystal cross section, with the result that an excess of interstitial silicon atoms prevails in the silicon single crystal produced, separation of at least one donor wafer from this silicon single crystal, bonding of the donor wafer to a carrier wafer, and reduction of the thickness of the donor wafer, with the result that a silicon layer having a thickness of less than 500 nm that is bonded to the carrier wafer remains.

In order to produce a silicon single crystal which has interstitial silicon atoms as the prevailing defect type in the entire volume (and in which an excess of agglomerated interstitial silicon atoms preferably prevails in a partial region), it is necessary, during the CZ method, to meet the condition $$v/G<(v/G)_{crit} \tag{2}$$

where the parameters are defined as for equation (1) (E. Dornberger, W. von Ammon, J. ELECTROCHEM. SOC. 143 (1996)

1648). This condition is significantly easier to fulfill than equation (1) for the production of perfect single crystals.

The single crystal is subsequently separated into wafers in a conventional manner, for example by means of an annular or wire saw. The wafers are then generally subjected to a plurality of mechanical and/or chemical removal steps which are selected for example from the group of lapping, grinding, edge rounding, etching and polishing and are performed successively in a suitable manner.

The finished donor wafer is bonded to a carrier wafer in such a way as to produce a fixed connection between the donor wafer and the carrier wafer. In the last step of the method according to the invention, the thickness of the donor wafer is reduced by means of a conventional method in such a way that all that remains of the donor wafer is a silicon layer having a thickness of less than 500 nm which is fixedly bonded to the carrier wafer.

The thickness reduction may be effected, for example, by means of known methods of thinning back, for example by grinding, etching, polishing or combinations thereof. Preferably, however, a separating layer is produced in the donor wafer before it is bonded to the carrier wafer. In this case, the reduction of the thickness of the donor wafer after bonding to the carrier wafer is predominately effected by splitting along the separating layer. The separating layer is preferably produced by implantation of ions, for example hydrogen ions or helium ions. Furthermore, it is also possible to produce a gettering layer, for example by implantation of argon or silicon ions, and then to diffuse hydrogen into the gettering layer to thusly define a separating layer. The splitting along the separating layer may be achieved by a thermal treatment or the action of mechanical forces or a combination thereof. The preferred method for producing the separating layer and for splitting along the separating layer is described in EP 533551 A1.

Donor wafers having interstitial silicon atoms as the prevailing defect type have various advantages in comparison with donor wafers in accordance with the prior art, i.e. epitaxially coated wafers or perfect silicon wafers:

Donor wafers according to the invention can be produced significantly more cost-effectively compared with epitaxially coated silicon wafers since the process step of epitaxial coating is obviated. Moreover, the donor wafers according to the invention do not have the structural defects that are typical of epitaxially coated silicon wafers and lead to problems during bonding to the carrier wafer. A further advantage is that the donor wafer according to the invention can be reused significantly more easily. After the silicon layer has been transferred to the carrier wafer, the donor wafer generally must be subjected to a rework process before it can be reused as a donor wafer, encompassing a smoothing, material-removing treatment of the surface, for example polishing. If an epitaxially coated silicon wafer is used as the donor wafer, the residues of the epitaxial layer are typically removed in this case. A renewed complicated epitaxial coating is thus necessary for the reuse as a donor wafer. This coating is obviated when using donor wafers according to the invention.

In contrast to perfect silicon wafers or silicon wafers with a neutral region, the donor wafers according to the invention, within the scope of the detection limits (approximately $1 \times 10^3/cm^3$; see FIG. 5), are distinguished by the complete absence of harmful vacancy agglomerates and OSF defects. Investigations for determining COPs are effected with the aid of SC1 treatments which can be used, depending on the treatment duration, to detect even very small defects (D. Gräf, M. Suhren, U. Lambert, R. Schmolke, A. Ehlert, W. von Ammon, P. Wagner; J. ELECTROCHEM. SOC. 145 (1998) 275). In this case, SC1 treatments can be used to detect not only vacancy agglomerates but also defects with oxides which, in contrast to the COPs (depressions), appear as elevations according to SC1 (M. Hourai, H. Nishikawa, T. Tanaka, S. Umeno, E. Asayama, T. Nomachi, G. Kelly; THE ELECTROCHEM. SOC. PV98-1 (1998) 453). OSF defects occur only in vacancy-rich regions, but not in regions in which interstitial silicon atoms prevail (D. Zemke, P. Gerlach, W. Zulehner, K. Jacobs, JOURNAL OF CRYSTAL GROWTH; Volume 139, Issues 1-2 (1994), 37).

Figure 2:
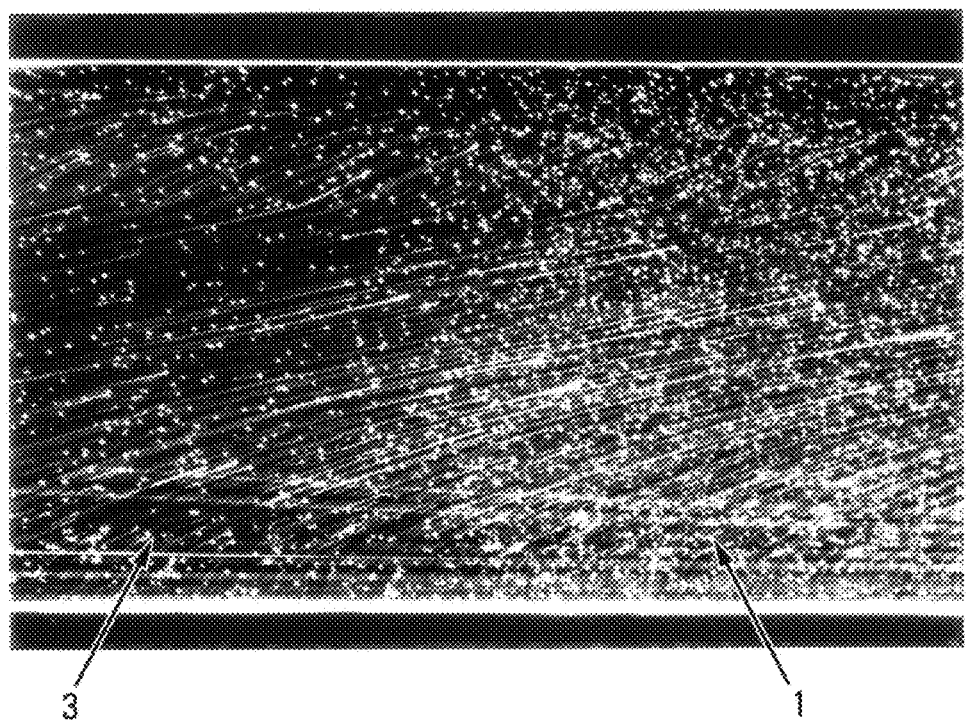
FIG. 2 shows a cross section through a silicon wafer having a diameter of 200 mm with a region in which vacancies prevail and a region in which interstitial silicon atoms prevail, after a BMD test.
Figure 3:
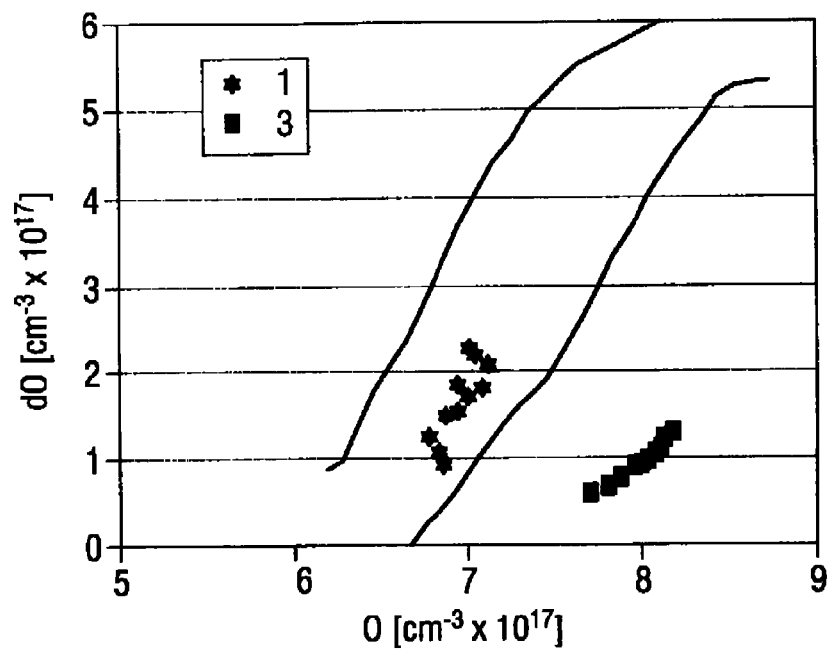
FIG. 3 illustrates the relationship between the initial oxygen content O and the content of precipitated oxygen dO after a BMD test for vacancy-rich silicon wafers 1 and silicon wafers 3 in which interstitial silicon atoms prevail.

Silicon wafers in which interstitial silicon atoms prevail also have the advantage of a lower tendency toward oxygen precipitation given a predetermined content of oxygen (FIG. 1-3). This suppresses the formation of oxygen precipitates in the donor wafer, which may occur for example during a thermal treatment that is carried out after the bonding of the donor wafer to the carrier wafer for the purpose of increasing the bonding force ("bond anneal"). Moreover, the use of the donor wafers according to the invention leads to a radially more homogeneous BMD density and oxygen precipitation than a perfect silicon wafer that has regions in which vacancies prevail and also regions in which interstitial silicon atoms prevail. Oxygen precipitates may lead to defects near the surface particularly in the case of repeated reuse of the donor wafer, which in total is associated with a considerable removal of material. These defects, in the silicon covering layer of the SOI wafer, may impair the function of components that are produced thereon. The use of donor wafers in which interstitial silicon atoms prevail effectively suppresses the formation of BMDs, even in the case of a relatively high oxygen content. This affords an additional advantage in the production of such wafers, since, by way of example, it is possible to dispense with complicated magnetic field apparatuses during crystal pulling. Thus, for example, it is possible to use donor wafers that have been produced from single crystals having an oxygen content of from $3 \times 10^{17}/cm^3$ to $7 \times 10^{17}/cm^3$, preferably from $5 \times 10^{17}/cm^3$ to $7 \times 10^{17}/cm^3$ and most preferably from $5 \times 10^{17}/cm^3$ to $6 \times 10^{17}/cm^3$. The oxygen content is measured in accordance with the ASTM F121-83 standard.

Silicon in which interstitial silicon atoms prevail has a lower rate of oxide growth than vacancy-rich silicon during oxidation. Perfect silicon wafers having radial regions of both types therefore oxidize inhomogeneously, the oxide layer growing more rapidly and thus attaining a larger thickness in the vacancy-rich regions than in the regions in which interstitial silicon atoms prevail. Since the donor wafers according to the invention have interstitial silicon atoms in their entire volume, these wafers oxidize significantly more homogeneously than perfect silicon wafers. Thus, a homogeneous oxide layer is achieved on the entire area of the silicon wafer during oxidation.

This property has a positive effect in particular when the surface of the donor wafer is oxidized and the donor wafer is subsequently bonded to a carrier wafer, for example composed of silicon. The silicon oxide layer (BOX) represents the insulator in this case. A silicon oxide layer having a layer thickness that is as homogeneous as possible is desirable. The invention makes it possible to produce an SOI wafer in which a silicon oxide layer is situated between the silicon layer and the carrier wafer, the silicon oxide layer having a layer thickness homogeneity of less than 1% given a thickness in the range of 3 nm to 30 nm or a layer thickness homogeneity of less than 2% given a thickness in the range of 1 nm to less than 3 nm. The term layer thickness homogeneity denotes the difference between maximum and minimum layer thickness per wafer relative to the average layer thickness. The oxidation is preferably effected in the temperature range of 700 to 900° C. for 5 to 60 min in a pure oxygen atmosphere or in a mixture comprising oxygen and water vapor. In this case, the target thickness is controlled by way of the selection of temperature, time, and water vapor content as essential parameters in the oxygen atmosphere.

Overall, the defect densities (density of defects attributable to agglomerated interstitial silicon atoms) measured in the donor wafers according to the invention are less than $10^4/cm^3$ and thus orders of magnitude lower than typical vacancy defect densities or else typical dislocation densities in SOI wafers produced by the so-called SIMOX method. For defect densities of aggregates of interstitial silicon atoms, the literature specifies values of $1\times10^3/cm^3$ to $8\times10^3/cm^3$ (R. Winkler, M. Sano; J. ELECTROCHEM. SOC. 141 (1994) 1398) or $3.6\times10^3/cm^3$ (R. Schmolke, W. Angelberger, W. von Ammon, H. Bender, GADEST (2001)). Defect densities of less than $10^4/cm^3$ correspond to an area-related defect density of less than $0.1/cm^2$ in the case of a silicon covering layer having a thickness of 100 nm. The defect density of the donor wafers according to the invention is comparable to the defect density in an epitaxial layer or a silicon wafer produced from a silicon single crystal produced according to the "floating zone" method (FZ method) (D. Gräf, M. Suhren, U. Lambert, R. Schmolke, A. Ehlert, W. v. Ammon, P. Wagner; J. ELECTROCHEM. SOC. 145 (1998) 275; R. Schmolke, D. Gräf, THE ELECTROCHEM. SOC. PV99-1 (1999) 386). It is known particularly from epitaxially coated silicon wafers, that the defect densities thereof are acceptable for the production and use of large scale integrated components.

Furthermore, donor wafers according to the invention can be produced in a significantly higher yield, and therefore more economically, than perfect silicon wafers. Producing a perfect silicon single crystal requires precise compliance with equation (1), but this is not possible over the entire length of the crystal and/or the entire cross section. Therefore, perfect silicon wafers can only be produced with a relatively low yield. By contrast, only the inequality (2) has to be fulfilled for producing the donor wafers according to the invention. This enables a significantly larger process window and thus a stable CZ process, which leads to a high yield of the desired product.

The donor wafers according to the invention, in which interstitial silicon atoms occur in the entire volume, can be used in the context of all methods for producing SOI wafers in which a silicon layer is transferred from a donor wafer to a carrier wafer.

EXAMPLES

Example 1

Silicon single crystals having a diameter of 200 mm were produced with a targeted variation of v/G in order to axially set in a targeted manner the transitions from a completely vacancy-rich region 1 (FIG. 1) to a ring wafer 2 with radially separate regions having an excess of vacancies or interstitial silicon atoms and also to a region 3 in which only interstitial silicon atoms occur. A pulling speed of less than 0.4 mm/min was chosen in the region in which the interstitial silicon atoms prevail. At this pulling speed, the condition $v/G<(v/G)_{crit}=1.3\times10^{-3}$ cm$^2$/(K·min) is fulfilled for the crystal pulling process used and the temperature gradient prevailing at the crystallization front (E. Dornberger and W. v. Ammon, J. ELECTROCHEM. SOC. 143 (1996) 1648).

Longitudinal sections from these crystals were subjected to a two-stage thermal treatment enabling BMDs to be produced in a targeted manner (3 h at 780° C. and then 16 h at 1000° C.; "Toshiba BMD test"). For preparation of the BMDs, the longitudinal sections were subsequently subjected to a bright etch, in the case of which 200 μm of material were removed, and then to a Secco treatment for 8 min. The higher precipitation of the vacancy-rich regions, the radial inhomogeneity of the precipitation in ring regions and the homogeneously low number of BMDs in the region in which interstitial silicon atoms prevail can clearly be discerned in the contrast in FIG. 1. The defect density of the region in which interstitial silicon atoms prevail is approximately $3\times10^3/cm^3$ to $4\times10^3/cm^3$ after the Secco etch. On wafers from different positions of one of these crystals, the oxygen concentrations (Oi, interstitial oxygen) were determined and the average BMD densities were determined according to the Toshiba BMD test (3 h/780° C.+16 h/1000° C.) (Tab. 1).

TABLE 1

| Rod position/cm | Oi/1 × 10$^{17}$/cm$^3$ | BMD Density/ 1 × 10$^8$/cm$^3$ | Defect region |
|---|---|---|---|
| 8 | 5.67 | 1.52 | 2 |
| 35 | 5.79 | 1.10 | 3 |
| 62 | 5.53 | 1.01 | 3 |

The silicon wafer obtained from the rod position 8 cm is a so-called ring wafer from the region designated by reference symbol 2 in FIG. 1. The silicon wafers from the positions 35 and 62 cm are distinguished by prevailing interstitial silicon atoms (FIG. 1, region 3). The wafers from the region 3 have a significantly lower average BMD density than the wafer from the region 2, although all the wafers have a similar oxygen content Oi. In the comparison of the average BMD densities, it should be taken into consideration that the position of the OSF ring lies at approximately radius/2 in the case of the ring wafer investigated, so that the area ratio of the outer region in which interstitial silicon atoms prevail and which precipitates to a lesser extent to the vacancy-rich inner region which precipitates to a greater extent is approximately 3:1.

Example 2

A silicon wafer from the ring region 2 (see FIG. 1) is broken according to the BMD test (3 h/780° C.+16 h/1000° C.) and treated with a Secco etch in order to incipiently etch the BMDs. FIG. 2 shows a significant change in precipitation at the transition from the vacancy-rich region 1 to the region 3 in which interstitial silicon atoms prevail: the BMD density is significantly lower in the region 3 than in the region 1.

Example 3

Silicon wafers from the regions 1 and 3 (see FIG. 1) with a different oxygen content O are treated in accordance with the BMD test (3 h/780° C.+16 h/1000° C.) and examined for precipitation. FIG. 3 shows the result of this examination. The change dO in the interstitial oxygen content is used as a measure of the precipitation. The higher the decrease dO in interstitial oxygen content, the higher the precipitation and BMD density of the relevant silicon wafers. In the case of a significantly higher concentration of interstitial oxygen, a comparable precipitation is achieved in interstitial-rich wafers 3 to that in the case of vacancy-rich wafers 1 with a significantly lower oxygen content. The S curve depicted describes the change dO of silicon wafers from the region 1 and is described in more detail in W. v. Ammon, A. Ehlert, W. Hensel, THE ELECTROCHEM. SOC. PROC. Vol. 93-15 (1993) 36.

Example 4

Figure 4:
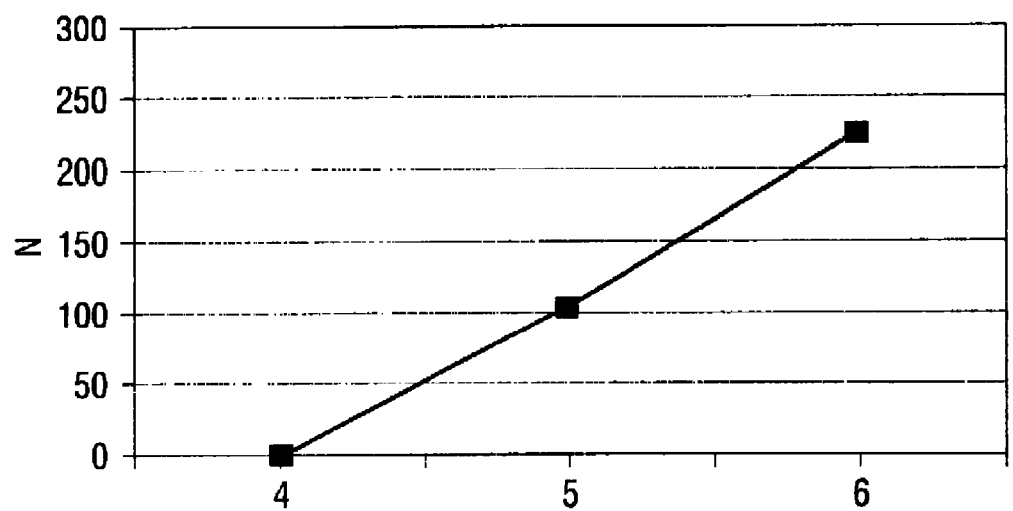
FIG. 4 shows the number of light scattering centers having a size of more than 90 nm on a silicon wafer, in the entire volume of which agglomerated interstitial silicon atoms prevail, as a function of the treatment duration with an SC1 solution.

Interstitial-rich silicon wafers having a diameter of 200 mm were treated with SC1 solution ($NH_4OH:H_2O_2:H_2O=1:1:5$) for different lengths of time at 85° C. Afterward, the wafers were examined using a surface inspection device (SP1-TB1; DWO channel; LLS>90 nm). As the result, FIG. 4 illustrates the number N of defects per silicon wafer as a function of the silicon removal. Point 4 is assigned to a silicon wafer that was not treated with SC1 solution. Points 5 and 6 show the defect densities of silicon wafers in which 360 nm and 1000 nm of material was respectively removed from the surface using the SC1 solution. The measurement resulted in a low number N of defects on the silicon wafer, which increases linearly with the thickness of the removed material. The defect density determined therefrom is $7.5 \times 10^3/cm^3$.

Example 5

Figure 5:
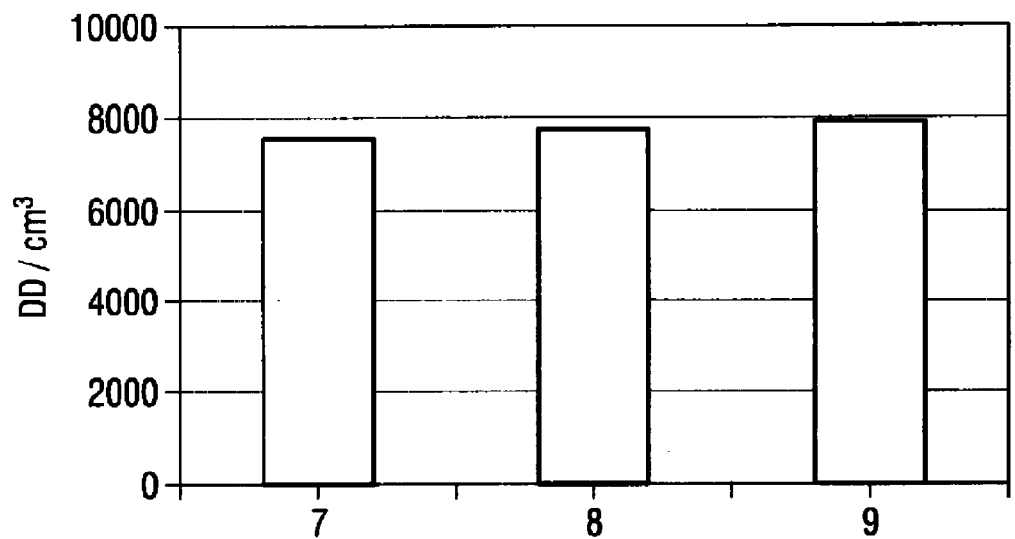
FIG. 5 shows the defect densities DD of silicon wafers, in the entire volume of which agglomerated interstitial silicon atoms prevail, in comparison with an epitaxially coated silicon wafer.

Interstitial-rich silicon wafers having a diameter of 300 mm were treated with the SC1 solution used in Example 4 at 85° C., 720 nm of material being removed. The wafers were subsequently examined analogously to Example 4 and the defect density was determined. The result is illustrated in FIG. 5, point 8. The measurement results in a low number of defects with a defect density DD determined therefrom of $7.8 \times 10^3/cm^3$. This value is comparable to the interstitial-rich wafers having a diameter of 200 mm in accordance with Example 4 (point 7 in FIG. 5) and to defect densities known from the literature (R. Schmolke, D. Gräf, THE ELECTROCHEM. SOC. PV99-1 (1999) 386) in the case of epitaxially coated silicon wafers having a diameter of 200 mm (point 9 in FIG. 5).

Example 6

Figure 6:
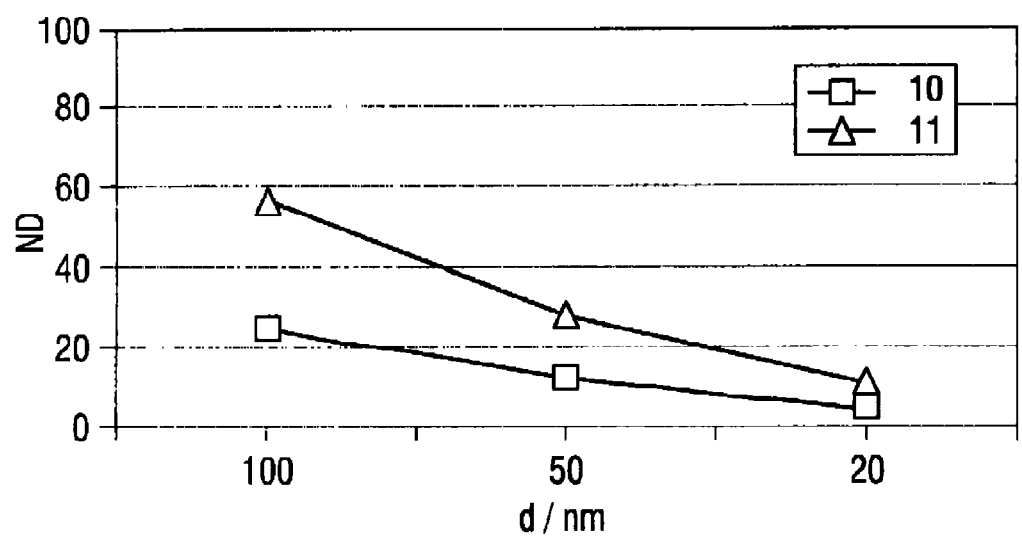
FIG. 6 shows the number ND of defects per SOI wafer as a function of the thickness d of the silicon covering layer.
Figure 2:
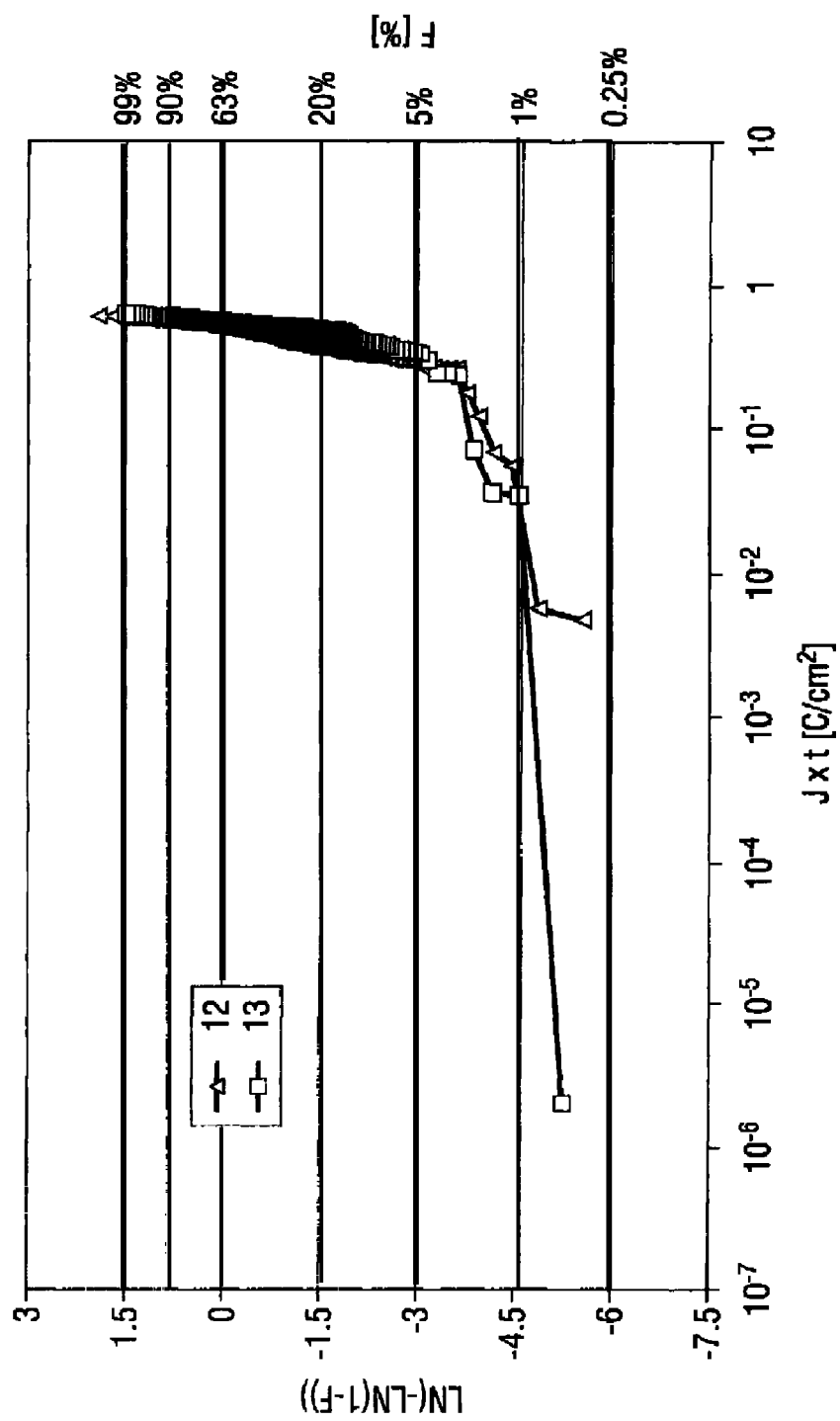

The defect densities of approximately $8 \times 10^3/cm^3$ determined in the case of the silicon wafers having a diameter of 200 mm and 300 mm (see Examples 4 and 5) lead to defect densities of $0.08/cm^2$ in the case of a use as donor wafers for the production of SOI wafers with a silicon covering layer having the thickness d of 100 nm (FIG. 6). In the case of a layer thickness of 20 nm, the defect density is less than $0.02/cm^2$, which corresponds to a number ND of fewer than 10 defects per wafer in the case of a wafer diameter of 200 mm (Plot 10) and a number ND of fewer than 15 defects per wafer in the case of a wafer diameter of 300 mm (Plot 11).

Example 7

An interstitial-rich silicon wafer 12 (FIG. 7) and an epitaxially coated silicon wafer 13, in each case having a diameter of 200 mm, were subjected to a gate oxide test. For this purpose, the wafers were oxidized at the surface, an oxide layer having a thickness of 25 nm being produced. The measurement was effected with a temporally progressively rising charge density J·t at contacts having a size of 8 $mm^2$. Both types of wafer exhibit a comparable breakdown and defect behavior. Very low defect densities of less than $0.1/cm^2$ can be determined therefrom for both types of wafer. In FIG. 7, F represents the proportion of the capacitors which exhibit a breakdown at the given charge density.

Example 8

Figure 8:
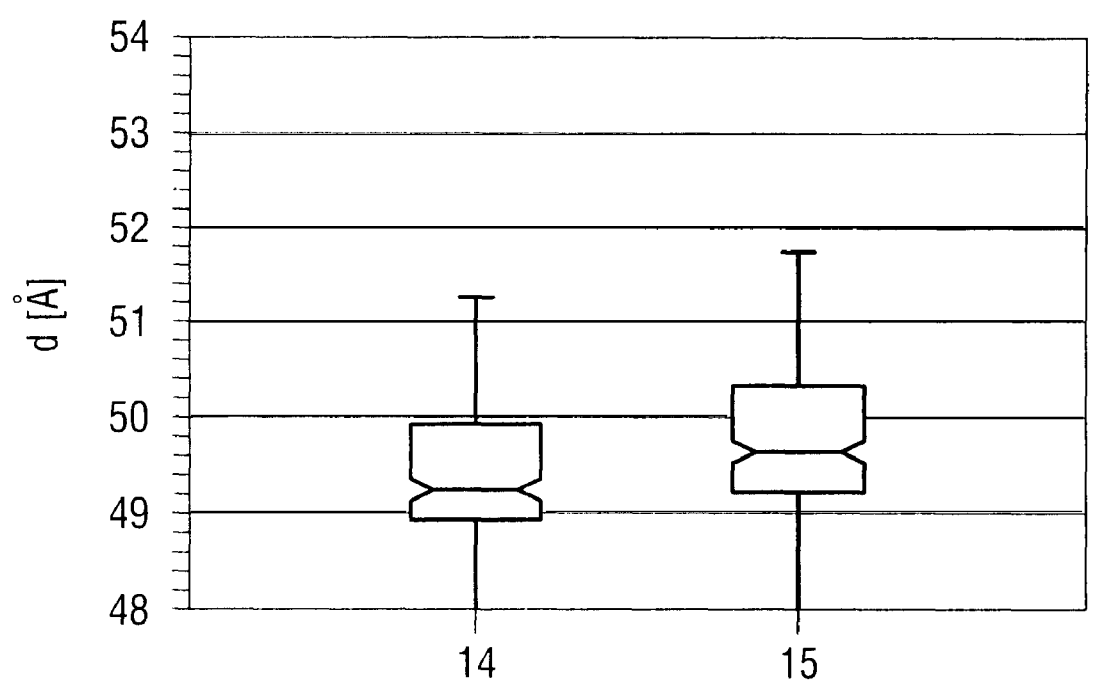
FIG. 8 shows the statistical evaluation of oxide layer thicknesses on vacancy-rich silicon wafers and silicon wafers having agglomerated interstitial silicon atoms.

Interstitial-rich silicon wafers 14 and vacancy-rich silicon wafers 15 (FIG. 8) having a diameter of 200 mm were oxidized to a target thickness of approximately 50 Å (=5 nm). The oxidation was effected at 800° C. for 9 min, in pure oxygen with a 15% water vapor content. The resulting oxide thickness was measured by means of a commercial ellipsometer with 49 measurement points per wafer and an edge exclusion of 2 mm.

Interstitial-rich material and vacancy-rich material behave differently in this case. The statistical evaluation with box and whisker plots shows a significant difference in the oxide thicknesses obtained for the two material groups. Thus, a radially different oxide thickness occurs in the case of material that is radially inhomogeneous with regard to point defects.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing an SOI wafer comprising a carrier wafer and a monocrystalline silicon layer having a thickness of less than 500 nm, an excess of interstitial silicon atoms prevailing in the entire volume of the silicon layer, comprising:
    a) producing a silicon single crystal by Czochralski crucible pulling, the condition $v/G<(v/G)_{crit}=1.3\times10^{-3}$ $cm^2/(K\times min)$ being fulfilled at the crystallization front over the entire crystal cross section, with the result that an excess of interstitial silicon atoms prevails in the silicon single crystal produced,
    b) separating of at least one donor wafer from the silicon single crystal,
    e) bonding the donor wafer to a carrier wafer, and
    f) reducing of the thickness of the donor wafer to provide a silicon layer having a thickness of less than 500 nm, bonded to the carrier wafer.

2. The method of claim 1, wherein a separating layer is produced in the donor wafer before it is bonded to the carrier wafer, and wherein at least a portion of the reduction of the thickness of the donor wafer after bonding to the carrier wafer is effected by splitting along the separating layer.

3. The method of claim 2, wherein the production of the separating layer comprises the implantation of ions.

4. The method of claim 2, wherein the splitting along the separating layer is achieved by a thermal treatment, the action of mechanical forces, or a combination thereof.

5. The method of claim 2, wherein the split part of the donor wafer that is not bonded to the carrier wafer is used as a donor wafer again after the surface of the donor wafer has been smoothed.

6. The method of claim 1, further comprising, following step B),
    c) implanting ions into a surface of the donor wafer to form a separation layer,
and wherein reduction of the thickness of the donor wafer in step f) comprises splitting the donor wafer along the separation layer.

7. The method of claim 3, wherein the ions implanted comprise ions of elements selected from the group consisting of hydrogen, helium, and mixtures thereof.

8. The process of claim 1, further comprising:
    c1) forming a separation layer by implanting at least one of argon ions or silicon ions into a surface of the donor wafer to form a gettering layer, and diffusing hydrogen into the gettering layer to form a separation layer, and wherein reduction of the thickness of the donor wafer in step f) comprises splitting the donor wafer along the separation layer.

9. The method of claim 1, further comprising:
d) oxidizing a surface of the donor wafer to form a silicon oxide insulating film,
and wherein the donor wafer is bonded to the carrier wafer in step e) such that said insulating film is located between the carrier wafer and the donor wafer.

10. The method of claim 6, further comprising:
d) oxidizing a surface of the donor wafer to form a silicon oxide insulating film,
and wherein the donor wafer is bonded to the carrier wafer in step e) such that said insulating film is located between the carrier wafer and the donor wafer.

11. The method of claim 9, wherein the thickness of the insulating film is between 1 nm to 30 nm, wherein the insulating film has a thickness homogeneity of less than 1% when the thickness is from 3 nm to 30 nm, and a thickness homogeneity of less than 2% when the thickness is from 1 nm to less than 3 nm.

12. The method of claim 1, wherein the defect density of agglomerated interstitial silicon atoms in the donor wafer is less than $10^4/cm^3$.

13. The method of claim 1, wherein the thickness of the silicon layer from the donor wafer after step f) is 100 nm or less, and the surface defect density of agglomerated interstitial silicon atoms is less than $0.1/cm^2$.

14. The method of claim 1, wherein the oxygen content of the donor wafer is from $3\times10^{17}/cm^3$ to $7\times10^{17}/cm^3$.

15. The method of claim 1, wherein the oxygen content of the donor wafer is from $5\times10^{17}/cm^3$ to $7\times10^{17}/cm^3$.

16. The method of claim 1, wherein a separating layer is formed below a surface of the donor wafer in a step c), and wherein step f) of reducing the thickness of the donor wafer comprises splitting along the separation layer by thermal treatment, the action of mechanical forces, or a combination thereof, to form an SOI wafer and a donor wafer remnant of lesser thickness than the original donor wafer.

17. The method of claim 16, wherein the donor wafer remnant is used again as a donor wafer to be bonded to a carrier wafer.

18. The method of claim 1, wherein the silicon layer is free of oxidation stacking faults.

* * * * *